United States Patent [19]
Schuegraf et al.

[11] Patent Number: 5,624,865
[45] Date of Patent: Apr. 29, 1997

[54] HIGH PRESSURE REOXIDATION ANNEAL OF SILICON NITRIDE FOR REDUCED THERMAL BUDGET SILICON PROCESSING

[75] Inventors: Klaus F. Schuegraf; Randhir P. S. Thakur; Pierre C. Fazan, all of Boise, Id.

[73] Assignee: Micron Technology, Inc., Boise, Id.

[21] Appl. No.: 542,979

[22] Filed: Oct. 13, 1995

[51] Int. Cl.$^6$ ............................. H01L 21/70; H01L 27/00
[52] U.S. Cl. ...................... 438/396; 438/762; 438/770; 438/398
[58] Field of Search ................. 437/52, 60, 919, 437/920, 238, 978, 983, 985; 148/14, 117–118

[56] References Cited

U.S. PATENT DOCUMENTS

| | | | |
|---|---|---|---|
| 5,023,683 | 6/1991 | Yamada | 257/300 |
| 5,386,382 | 1/1995 | Ahn | 437/52 |
| 5,504,029 | 4/1996 | Murata et al. | 437/52 |

Primary Examiner—Jey Tsai
Attorney, Agent, or Firm—Reed Smith Shaw & McClay

[57] ABSTRACT

A semiconductor integrated circuit fabrication method is provided for forming a capacitor on a semiconductor integrated circuit substrate. A lower capacitor electrode is formed over the semiconductor integrated circuit substrate and a capacitor dielectric is formed over the lower capacitor electrode. The capacitor dielectric is preferably formed of silicon nitride. A reoxidation anneal of the capacitor dielectric is performed at a pressure greater than one atmosphere in order to form an oxide layer over the capacitor dielectric. An upper capacitor electrode is disposed over the oxide layer to form a capacitor. The capacitor is formed as part of a dynamic random access memory cell. A transistor is formed upon the semiconductor integrated circuit substrate and the lower capacitor electrode is formed in electrical contact with a diffusion region of the transistor. The capacitor is formed within an opening in molding material that is deposited over the surface of the semiconductor integrated circuit substrate. The reoxidization anneal of the capacitor dielectric is performed at a temperature in the range of 600° C. to 800° C. at pressures ranging up to twenty-five atmospheres. This forms an oxide layer having a thickness between five angstroms and fifteen angstroms in a period of time short enough to prevent excessive out diffusion of dopants from the diffusion regions of the transistor.

26 Claims, 5 Drawing Sheets

HIGH PRESSURE REOXIDATION ANNEAL OF SILICON NITRIDE FOR REDUCED THERMAL BUDGET SILICON PROCESSING

BACKGROUND OF THE INVENTION

1. Field of the Invention

This invention relates to the field of semiconductor integrated circuit fabrication and, in particular, to the fabrication of capacitors in small dynamic random access memory cells.

2. Background Art

The memory cells of dynamic random access memories (DRAMS) include two major components: a field effect transistor and a capacitor. It is well known in the art of semiconductor fabrication to use planar capacitors within DRAM cells. However, in DRAM cells that utilized conventional planar capacitors (such as the one depicted in prior art FIG. 1), more integrated circuit surface area was dedicated to the planar capacitor 11 than to the field effect transistor (FET) 12.

The gate 13 of the FET 12 and a word line 14 were formed from an etched polycrystalline silicon layer in these memory cells. A bit line 15 was connected to an access node junction 16. The planar capacitor 11 had a lower plate formed from the n+ silicon substrate extension 17 of the storage node junction 18 of the FET 12. An upper capacitor plate (or field plate) 19 was formed from a layer of conductively doped polycrystalline silicon. The substrate extension 17 was electrically insulated from the upper plate 19 by a dielectric layer 20. Planar capacitors such as the planar capacitor 11 generally proved to be adequate for use in DRAM integrated circuits up to approximately the one megabit level. However, planar capacitors constructed with conventional dielectric materials were not usable for the small memory cell sizes required beyond the one megabit DRAM level.

As memory cell size and therefore capacitor size shrank, several problems increased with respect to the fabrication of cell capacitors. For example, the problems that increased as capacitors shrank included rapid dissipation of the charge within the memory cell, resulting in "soft" errors, and reduction of the sense amp differential signal. This degraded noise sensitivity and made it more difficult to provide appropriate signal selectivity. Additionally, as cell capacitance decreased the cell refresh time generally shortened. Shorter refresh times required more frequent interruptions for refresh overhead.

Furthermore, as component density in integrated circuit memories increased, the shrinkage of memory cell size resulted in a number of other problems in addition to the problems associated with smaller capacitors. Among the other resulting problems was the problem of dopant out diffusion when forming the transistors of the memory cells. In order to form transistors, dopants must be implanted in regions of the semiconductor material. However, the dopants tended to diffuse out of the transistor regions when the transistors were heated during subsequent integrated circuit processing steps, for example, during the reoxidation anneal of the dielectric layer of the cell capacitor.

In prior art methods of DRAM cell fabrication, the problems caused by out diffusion of dopants from transistor regions were relatively small. However, as DRAM cell sizes continued to shrink, the channel lengths of transistors such as the FET 12 also had to shrink. Additionally, in smaller memory cell sizes, the junctions of transistors such as the FET 12 were required to be more shallow. When this occurred, the problem of out diffusion caused by subsequent heating steps increased. Dealing with out diffusion problems in the smaller cell geometries required tighter process control. Tighter process control added expense to the fabrication process.

Several methods for providing adequate cell capacitance in view of shrinking cell size have been developed. One well known method involved the creation of trench capacitors in the cell substrate. FIG. 2 depicts a DRAM cell that included a typical trench capacitor 21. Similar in concept to the planar capacitor 11 of FIG. 1, the trench capacitor 21 included a trench that was used to provide greater plate area, and hence, greater storage capacitance within the memory cell. The lower plate 22 of the trench capacitor 21 could be formed from the n+ doped silicon substrate or from a polycrystalline silicon layer which lined a trench cut in the n+ doped silicon substrate. The upper plate 23 of the trench capacitor 21 was formed from a layer conductively doped polycrystalline silicon. The lower plate 22 and the upper plate 23 were electrically insulated from each other with a dielectric layer 24.

The dielectric layer 24 of the trench capacitor 21 was typically deposited using a conventional chemical vapor deposition method. After deposition of the dielectric layer 24 a reoxidation anneal of the dielectric layer 24 was performed at atmospheric pressure. The typical temperature for the reoxidation anneal of the dielectric layer 24 was in excess of 800° C. Annealing at temperatures this high contributed heavily to the thermal budget of the fabrication of the DRAM cell, thereby adding expense to the fabrication process. Additionally, during the reoxidation anneal of the dielectric layer 24 the diffusion regions of the FET 12 were heated to high temperatures as well as the dielectric layer 24. The heating of the diffusion regions of the FET 12 contributed to out diffusion of dopants from the diffusion regions of the FET 12 as previously described.

Another way to provide adequate cell capacitance in view of shrinking cell size was providing a dielectric material having a higher dielectric constant. Using a capacitor dielectric material having a higher dielectric constant to form dielectric layer 24 provided a larger capacitance in the same surface area of the FET 12. For this reason capacitors within DRAM cells often used a silicon nitride film as a dielectric layer rather than a silicon dioxide film. The dielectric constant of silicon nitride film is 1.5 to 2 times larger than that of the thermally grown silicon dioxide film used in the storage capacitors of conventional cells. The greatly increased dielectric constant of silicon nitride permitted increased capacitance in a predetermined cell surface area. Moreover, the frequency dispersion of the silicon nitride film dielectric constant was very small. Accordingly, the use of silicon nitride film in the storage capacitors of the smaller memory cells was preferred over the use of silicon dioxide.

However, dielectric materials within capacitors must also have as small a leakage current as possible in order to form a lossless capacitor. Silicon nitride has less desirable leakage current properties than silicon dioxide. In particular, the leakage current through silicon nitride films is larger than through silicon dioxide films that are thermally grown on silicon substrate because the energy bandgap of silicon dioxide is more narrow. The energy bandgap of silicon is 5 eV and the energy bandgap of silicon dioxide is 8 eV.

It is known in the prior art of forming capacitors within semiconductor integrated circuits that reoxidizing a layer of silicon nitride enough to form a thin oxide layer upon the surface of the silicon nitride reduced the leakage current of a silicon nitride film. Furthermore, it was determined that use of the oxide layer provided generally acceptable storage properties, including satisfactory breakdown voltage, where the breakdown voltage of the films was defined as the voltage at which a leakage current of 0.1 A/cm$^2$ or destructive breakdown of the films occurred.

For example, in a typical prior art method, a forty nanometer thick silicon nitride layer was deposited by chemical vapor deposition using $SiH_4$ and $NH_3$ gases to form a dielectric layer of a capacitor of a DRAM cell such as the dielectric layer 24 of the FET 12. Very thin oxides were formed on the silicon nitride film surfaces by the reoxidation anneal process. Practice confirmed that the oxides formed in this manner were effective to sufficiently reduce the leakage current. Very good results were obtained with silicon nitride films, preferably in the range of forty to eighty angstroms thick, with thin oxides of approximately three nanometer thickness on their surfaces from oxidation treatment.

Therefore, in general, in order to obtain the advantages of the high dielectric constant of the silicon nitride a reoxidation anneal of the silicon nitride was required. This contributed to the thermal budget of the fabrication process and to out diffusion of dopants from the transistor regions.

Though the dielectric constant of the silicon nitride film was reduced somewhat by the oxidation treatment, it remained sufficiently large to provide the required capacitance. The leakage current through the silicon nitride film is bulk limited and it did not change with electrode material, electrode flatness or applied voltage polarity. This is very different from the leakage current through fully grown silicon dioxide films which is electrode limited.

Another structure for providing the storage capacitance required in DRAM cells as the size of the memory cells shrank, in addition to the trench structures and higher dielectric constant material in the capacitors, was a stacked capacitor structure on the DRAM cell surface. FIG. 3 is a graphical representation of a typical DRAM cell that included a stacked capacitor 31. The lower plate 32 of the stacked capacitor 31 was formed from a conductively doped n-type polycrystalline silicon layer that was in electrical contact with the silicon substrate 33 in the region of the FET storage node junction. The upper plate 34 of the stacked capacitor 31 was also formed from a conductively doped polycrystalline silicon layer.

The two polycrystalline silicon layers 32, 34, serving as the capacitor electrodes of the stacked capacitor 31, were separated by a dielectric layer 35. The dielectric layer 35 of the stacked capacitor 31 could be annealed in substantially the same manner as that previously described with respect to the reoxidation anneal of dielectric layer 24 of the trench capacitor 21 to form a thin layer of oxide on the surface of the dielectric layer 34. The lower plate 32 and the upper plate 34 of the stacked capacitor 31 were both stacked on top of the FET 12 and on top of an adjacent word line 36. The stacking approach to building capacitors in DRAM cells provided additional capacitance in a small memory cell and therefore provided an alternate solution to the trench capacitor method. However, it did not solve the problem of out diffusion from the diffusion regions of the transistors of the memory cells during the reoxidation anneal of the dielectric layers of the stacked capacitors and other high temperature steps of the fabrication process.

It is therefore an object of the present invention to provide an improved method for fabricating capacitors within very small DRAM cells wherein the capacitors have suitable storage properties including suitable capacitance, breakdown voltage and sense amp differential signal.

It is a further object of the present invention to provide a reduced thermal budget for the fabrication of DRAM cells having capacitors with reoxidized dielectric layers.

It is a further object of the present invention to sufficiently reduce the out diffusion of dopants from transistor regions within the transistors of DRAM cells to permit formation of shallow transistor junctions and short transistor channels without a requirement for tight control of the fabrication process in small DRAM cells.

These and other objects and advantages of the present invention will become more fully apparent from the description and from the claims which follow or may be learned by the practice of the invention.

SUMMARY OF THE INVENTION

A semiconductor integrated circuit fabrication method is provided for forming a capacitor on a semiconductor integrated circuit substrate. A lower capacitor electrode is deposited over the semiconductor integrated circuit substrate and a capacitor dielectric is deposited over the lower capacitor electrode. The capacitor dielectric is preferably formed of silicon nitride. A reoxidation anneal of the capacitor dielectric is performed at a pressure greater than one atmosphere in order to form an oxide layer over the capacitor dielectric. An upper capacitor electrode is deposited over the oxide layer to form an integrated circuit capacitor. The integrated circuit capacitor is formed in a dynamic random access memory cell. A transistor is formed upon the semiconductor integrated circuit substrate and the lower capacitor electrode is formed in electrical contact with a diffusion region of the transistor. The capacitor is formed within an opening in molding material such as BPSG or TEOS that is deposited over the surface of the semiconductor integrated circuit substrate. The upper and lower capacitor electrodes can be formed of polycrystalline silicon. The reoxidization anneal of the capacitor dielectric is performed at a temperature in the range of approximately 600° C. to approximately 800° C. at pressures ranging up to twenty-five atmospheres. This forms an oxide layer having a thickness between approximately five angstroms and approximately fifteen angstroms in a period of time short enough to prevent excessive out diffusion of dopants from the diffusion regions of the transistor.

BRIEF DESCRIPTION OF THE DRAWINGS

Each of the FIGS. 1–9 depicts a cross-sectional representation of DRAM cells. FIGS. 1–3 depict prior art DRAM cells while

FIG. 1 is a cross-sectional representation of a DRAM cell having a prior art planar capacitor configuration with a reoxidation annealed dielectric layer;

FIG. 2 is a cross-sectional representation of a DRAM cell having a prior art trench capacitor configuration with a reoxidation annealed dielectric layer;

FIG. 3 is a cross-sectional representation of a DRAM cell having a prior art stacked capacitor configuration with a reoxidation annealed dielectric layer;

FIGS. 4–9 are cross-sectional representations of a stacked capacitor having a dielectric layer that is reoxidation annealed with a reduced thermal budget in accordance with the method of the present invention.

DETAILED DESCRIPTION OF THE INVENTION

Figure 1:
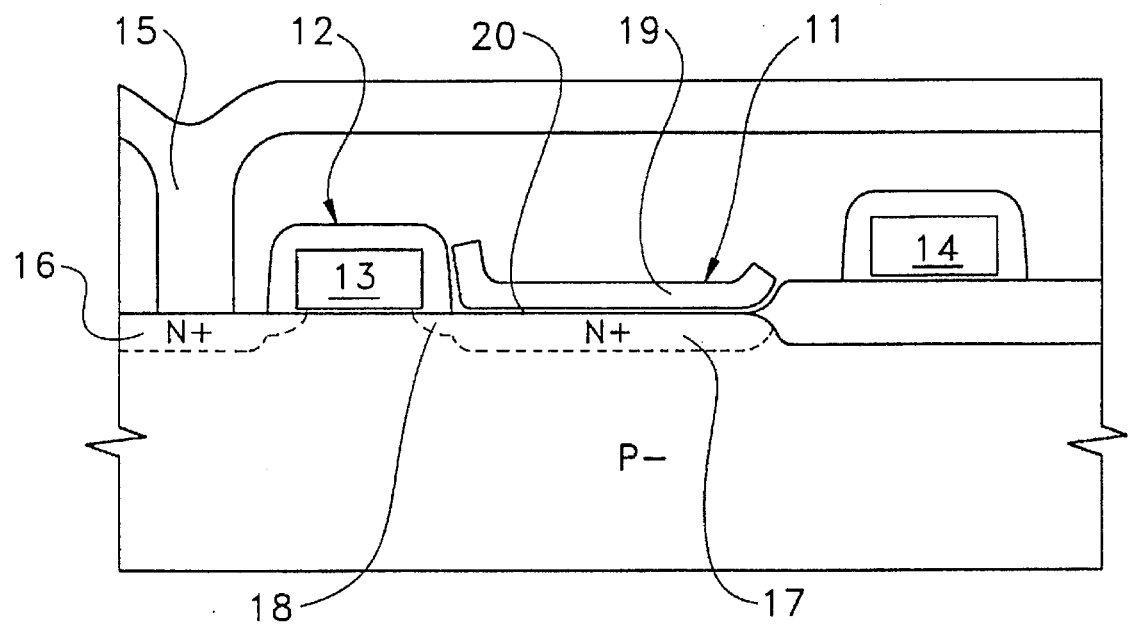
Figure 2:
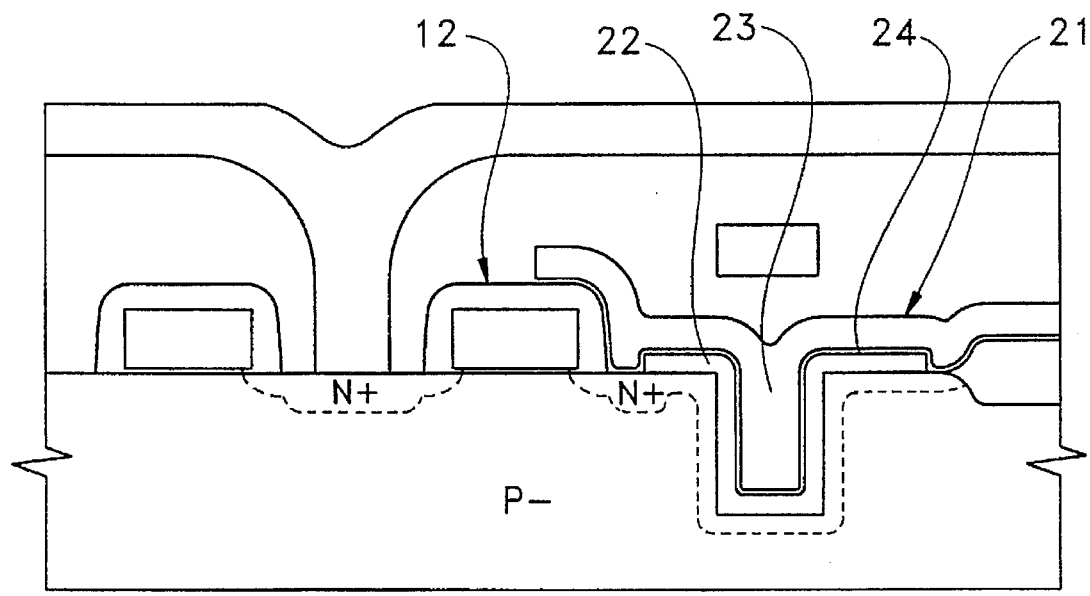
Figure 3:
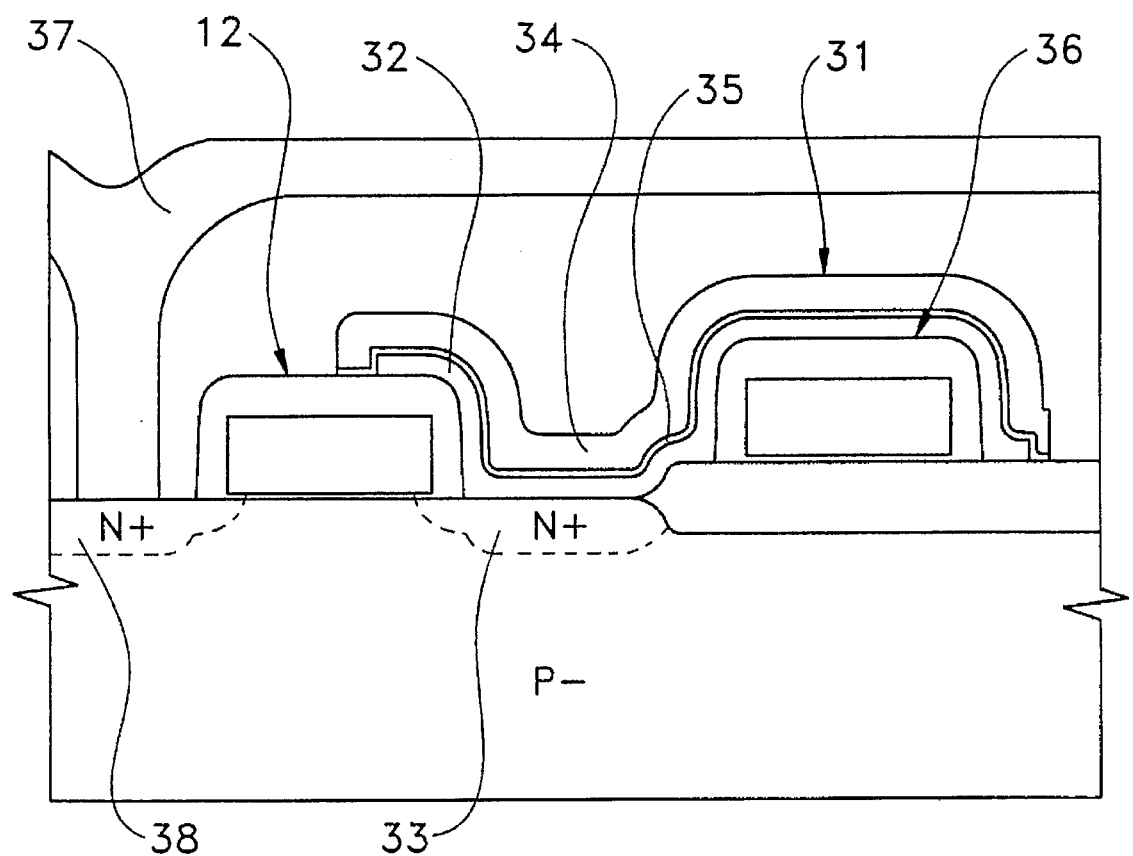
Figure 4:
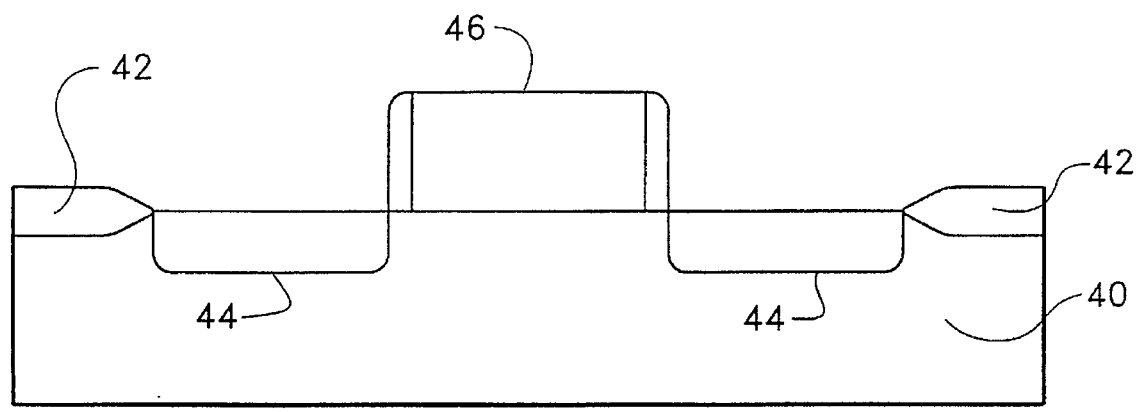
FIGS. 4–9 depict method steps in a process for fabricating the capacitor of a DRAM cell in accordance with the present invention. In particular.

Referring now to FIG. 4, there is shown a cross-sectional representation of semiconductor integrated circuit substrate 40. Transistor 46, having diffusion regions 44, is formed upon the surface of semiconductor integrated circuit substrate 40. Two field oxide regions 42 are also formed upon the surface of semiconductor integrated circuit substrate 40. Transistor 46, which is located between the two field oxide regions 42, can be a conventional field effect transistor of the type well known by those skilled in the art of integrated circuit fabrication technology. Diffusion regions 44 of transistor 46 can be a conventional transistor source or transistor drain, as also well known by those skilled in the art.

Figure 5:
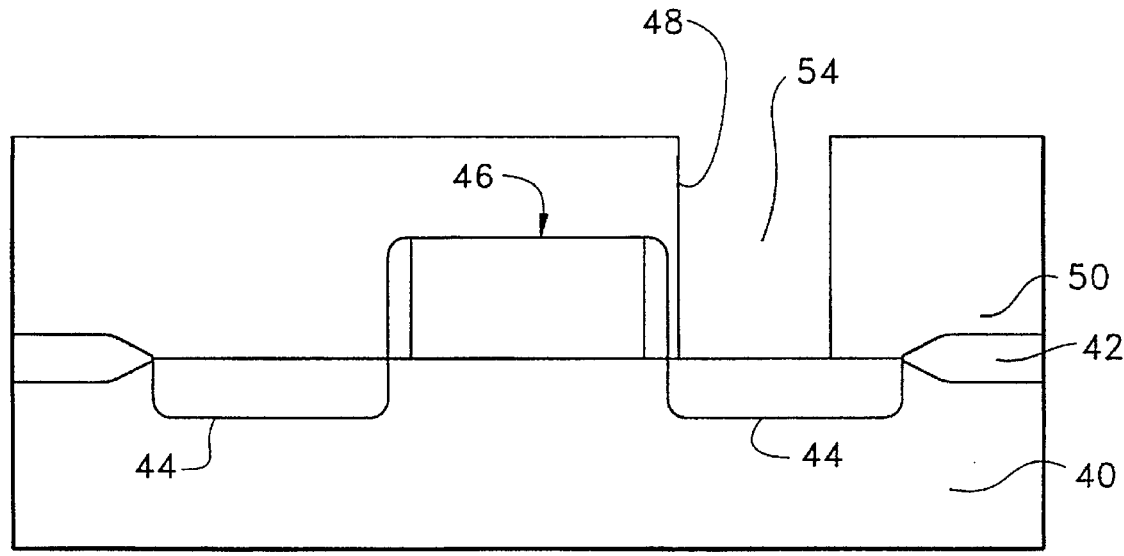

Referring now to FIG. 5, molding material 50 is deposited over the surface of semiconductor substrate 40 covering field oxide regions 42 and transistor 46. Opening 54 is formed through molding material 50. A vertical inner wall 48 of opening 54 extends from the top surface of molding material 50 downwardly to the surface of semiconductor substrate 40. Molding material 50 can be formed of a glass such as BPSG or TEOS, or any other material suitable for serving as a mold for the formation of a stacked capacitor within a DRAM cell as understood by those skilled in the art. Opening 54 through molding material 50 is formed immediately adjacent a diffusion region 44 of transistor 46.

Figure 6:
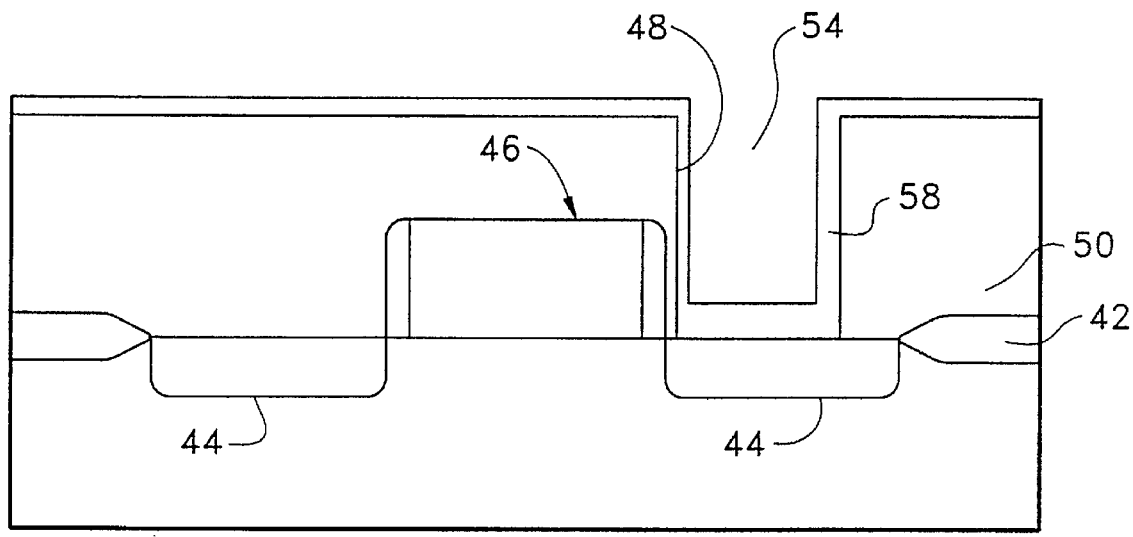

Referring now to FIG. 6, polycrystalline silicon layer 58 is deposited over the surface of molding material 50. The conformal nature of the depositing of polycrystalline silicon layer 58 causes the polycrystalline silicon material that forms polycrystalline silicon layer 58 to be deposited upon substantially the entire surface of inner wall 48 of opening 54 of molding material 50. Polycrystalline silicon layer 58 is also deposited upon the surface of semiconductor substrate 40 at the bottom of opening 54. Silicon layer 58, as well as any of the materials used in the method of the present invention, can be disposed above the substrate 40 in any manner known to those skilled in the art.

Polycrystalline silicon layer 58, which may also be referred to as polysilicon layer 58, can be formed of a rugged form of polysilicon in order to enhance the surface area of polysilicon layer 58. The enhanced surface area of the polysilicon layer 58 increases the capacitance of a capacitor formed within opening 54. The ruggedizing of polysilicon layer 58 can be achieved, for example, by forming hemispherical grained silicon (HSG) using any of the well known techniques for forming HSG. The thickness of polysilicon layer 58 is not critical to the method of the present invention. In the preferred embodiment of the present invention the thickness of polysilicon layer 58 can be less than approximately one hundred nanometers.

As previously described, opening 54 through molding material 50 is formed immediately adjacent diffusion region 44 of transistor 46. Thus, when polysilicon layer 58 is disposed upon inner wall 48 of opening 54, polysilicon layer 58 is placed in physical contact with a diffusion region 44. In this manner polysilicon layer 58 is formed in electrical contact with a diffusion region 44 of transistor 46 upon the surface of semiconductor substrate 40.

Figure 7:
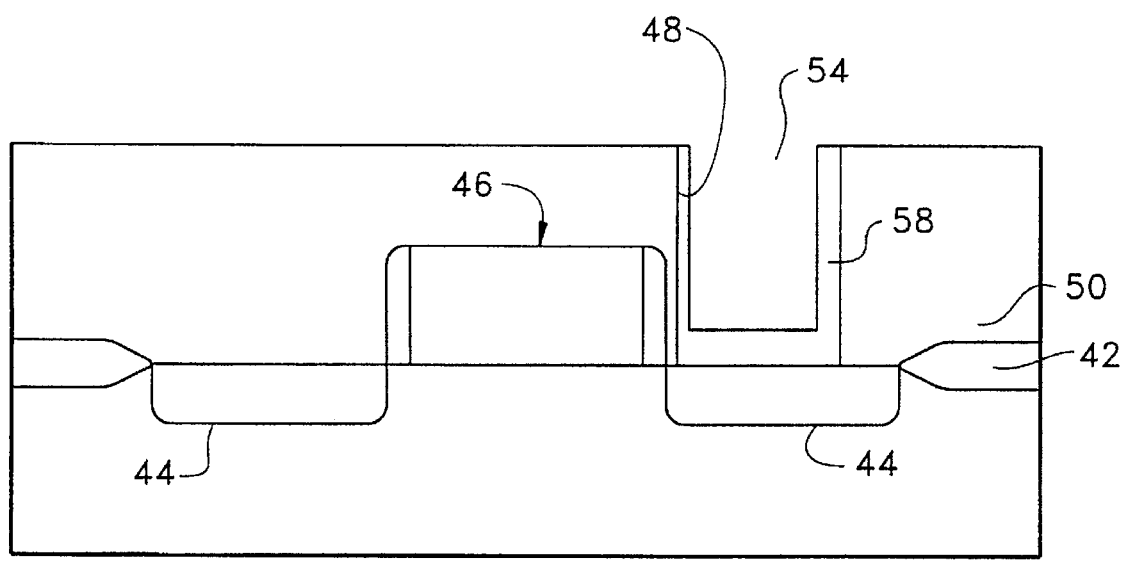
Figure 8:
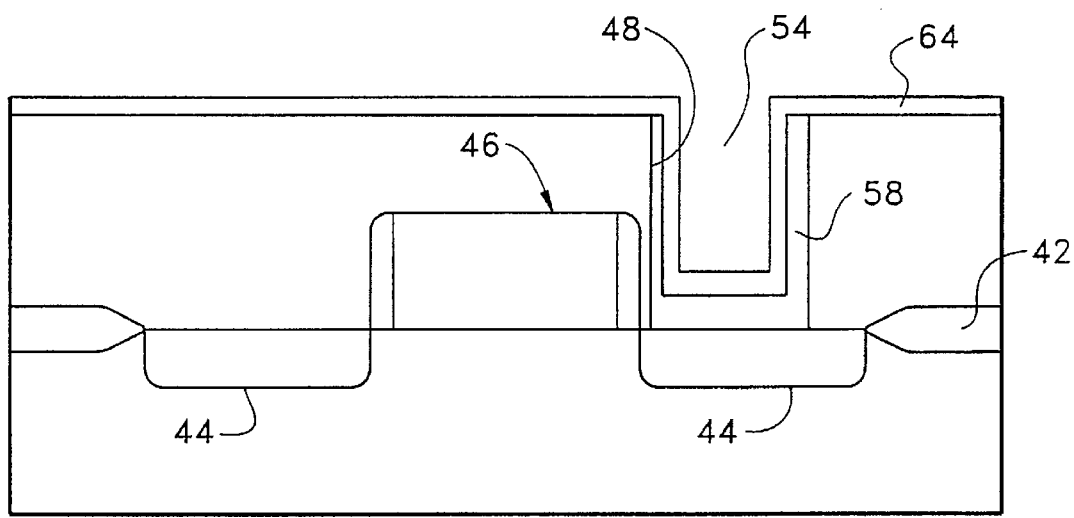
Figure 9:
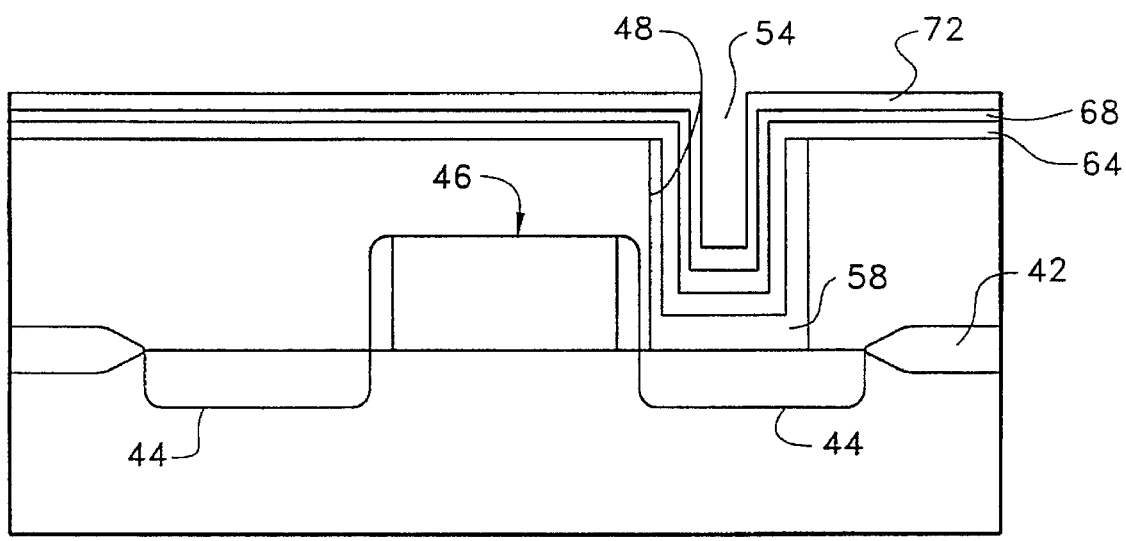

Referring now to FIGS. 7, 8 and 9, polysilicon layer 58 is defined in order to form a bottom capacitor electrode, which is shown as bottom electrode 58 in the drawings. Polysilicon layer 58 can be defined to form bottom capacitor electrode 58 by etching back polysilicon layer 58 using a dry etch, by a mechanical polishing step, or by any other method known to those skilled in the art of semiconductor integrated circuit fabrication. Capacitor dielectric layer 64 is then deposited over bottom capacitor electrode 58 within opening 54 and the surface of molding material 50 that is exposed due to the removal of portions of polysilicon layer 58. In this manner, the surface of bottom capacitor electrode 58 within opening 54 is completely covered by capacitor dielectric layer 64.

Capacitor dielectric layer 64 can be formed of any dielectric material suitable for fabricating capacitors within opening 54 of molding material 50. However, in the preferred embodiment of the present invention, capacitor dielectric layer 64 is formed of silicon nitride. Because molding material 50 and layer 64 are both formed of dielectric material, there is no need to remove the portions of dielectric layer 64 extending over molding material 50. The temperature of the depositing of dielectric layer 64, when dielectric layer 64 is formed of silicon nitride, can be in the range of approximately 650° C. to approximately 800° C. The pressure during the depositing of dielectric layer 64 is one atmosphere. When dielectric layer 64 is formed of silicon nitride it can have a thickness of between approximately forty angstroms and approximately one hundred angstroms.

Following the depositing of capacitor dielectric layer 64, a reoxidation anneal of capacitor dielectric layer 64 is performed and polysilicon layer 72 is then deposited over the reoxidized layer to serve as the upper electrode of the capacitor. Prior to depositing polysilicon layer 72, the reoxidation anneal of dielectric layer 64 forms a thin oxide layer 68 upon the surface of dielectric layer 64. The reoxidation anneal in accordance with the method of the present invention can be performed in an oxygen rich environment at temperatures of greater than approximately 600° C. and at pressures between one atmosphere and approximately twenty-five atmospheres. It can be performed in a furnace with fast ramping or by rapid thermal processing or any other method of applying thermal energy to dielectric layer 64.

The reoxidation anneal method of the present invention can be applied to the dielectric layers of capacitors in EPROMs as well as the capacitors in DRAMs. Furthermore, it can be applied to any other type of deposited dielectric material requiring a reoxidation anneal step. In particular, it can be applied to any silicon nitride film requiring a reoxidation anneal including silicon nitride film within any type of capacitor. The oxygen rich environment of the reoxidation anneal step can be obtained using $H_2O$, $O_2$, $O_3$, NO, or $N_2O$ gases. While the reoxidation anneal of dielectric layer 64 can be performed at temperatures between approximately 600° C. and 800° C., the preferred temperature range is between approximately 600° C. and approximately 700° C. The preferred value of temperature for the reoxidation anneal is approximately 650° C. The preferred pressure of the reoxidation anneal step is ten atmospheres. When capacitor dielectric layer 64 is formed of silicon nitride and provided with oxide layer 68 in this manner, the leakage current through capacitor dielectric layer 64 is extremely small. In addition, the breakdown voltage distribution and other parameters of silicon nitride layer 64 reoxidized in this manner are also acceptable.

The thickness of oxide layer 68 formed upon dielectric layer 64 in this manner can be between approximately five angstroms and approximately fifteen angstroms in the DRAM applications. In the EPROM applications it can be between approximately two-hundred and two-hundred and fifty angstroms. The preferred thickness of oxide layer 68 is approximately ten angstroms in the DRAM applications. In the EPROM application it can be approximately fifty angstroms. Because the reoxidation anneal step is performed at a pressure in excess of one atmosphere in this manner, the amount of time required to form an oxide layer 68 of a required thickness is decreased and the thermal budget for forming the DRAM cell is therefore decreased. Because of the lowered temperature and the decreased duration of the reoxidation anneal, the amount of out diffusion of dopants from the transistor diffusion regions that occurs during the reoxidation anneal is decreased and the need for more expensive process control is decreased. It will be understood that a further increase in pressure during the reoxidation anneal step further decreases the time required for the reoxidation anneal and, therefore, the amount of out diffusion of dopants.

The improvements provided by the method of the present invention permit better control over the junction depth of transistors such as transistor 46. Better control over transistor channel length is also obtained, thereby permitting shorter transistor channels to be built. Thus the performing of the reoxidation anneal of dielectric layer 64 at pressures in excess of one atmosphere can be advantageously applied to the fabrication of small DRAM cells.

It is to be understood that although the present invention has been described with reference to a preferred embodiment, various modifications, known to those skilled in the art, can be made to the structures and process steps presented herein without departing from the invention as recited in the several claims appended hereto.

We claim:

1. A semiconductor integrated circuit fabrication method for forming a capacitor on a semiconductor integrated circuit substrate, comprising the steps of:

(a) disposing a first capacitor electrode over said semiconductor integrated circuit substrate;

(b) disposing a capacitor dielectric over said first capacitor electrode;

(c) reoxidizing said capacitor dielectric at a pressure greater than one atmosphere to form an oxide layer upon said capacitor dielectric; and (d) disposing a second capacitor electrode over said oxide layer to form an integrated circuit capacitor.

2. The semiconductor fabrication method of claim 1, wherein said capacitor dielectric is formed of silicon nitride.

3. The semiconductor fabrication method of claim 1, wherein said capacitor dielectric has a thickness within the range of approximately forty angstroms to approximately one hundred angstrom.

4. The semiconductor fabrication method of claim 1, wherein a transistor is disposed over said semiconductor integrated circuit substrate.

5. The semiconductor fabrication method of claim 4, wherein said integrated circuit capacitor is in electrical contact with said transistor.

6. The semiconductor fabrication method of claim 5, wherein said transistor includes at least one diffusion region and said integrated circuit capacitor is in electrical contact with said diffusion region.

7. The semiconductor fabrication method of claim 6, wherein said transistor includes a transistor source and said integrated circuit capacitor is in electrical contact with said transistor source.

8. The semiconductor fabrication method of claim 7, wherein said first capacitor electrode is in electrical contact with said transistor source.

9. The semiconductor fabrication method of claim 4, wherein said integrated circuit capacitor and said transistor form a dynamic random access memory cell.

10. The semiconductor fabrication method of claim 1, wherein said integrated circuit capacitor comprises a stacked capacitor.

11. The semiconductor fabrication method of claim 1, further comprising molding material wherein said integrated circuit capacitor is formed within molding material disposed over the surface of said semiconductor integrated circuit substrate.

12. The semiconductor fabrication method of claim 11, wherein said integrated circuit capacitor is formed within an opening in said molding material.

13. The semiconductor fabrication method of claim 12, wherein said molding material is formed of glass.

14. The semiconductor fabrication method of claim 12, wherein said molding material is formed of BPSG.

15. The semiconductor fabrication method of claim 1, wherein at least one of said first and second capacitor electrodes is formed of polycrystalline silicon.

16. The semiconductor fabrication method of claim 15, wherein said polycrystalline silicon comprises ruggedized silicon.

17. The semiconductor fabrication method of claim 16, wherein said ruggedized silicon comprises hemispherical grained silicon.

18. The semiconductor fabrication method of claim 1, wherein step (c) is performed at a temperature within the range of approximately 600° C. to approximately 800° C.

19. The semiconductor fabrication method of claim 1, wherein step (c) is performed at a temperature in the range of approximately 600° C. to approximately 700° C.

20. The semiconductor fabrication method of claim 1, wherein step (c) is performed at a temperature of approximately 650° C.

21. The semiconductor fabrication method claim 1, wherein said oxide layer has a thickness of between approximately five angstroms and approximately fifteen angstroms.

22. The semiconductor fabrication method of claim 1, wherein said oxide layer has a thickness of approximately ten angstroms.

23. The semiconductor fabrication method of claim 1, wherein step (c) is performed at a pressure of less than approximately twenty-five atmospheres.

24. The semiconductor fabrication method of claim 1, wherein step (c) is performed at a pressure of less than approximately ten atmospheres.

25. The semiconductor fabrication method of claim 1, wherein step (c) is performed at a pressure of approximately ten atmospheres.

26. The semiconductor fabrication method of claim 1, wherein step (c) comprises a reoxidizing anneal of said capacitor dielectric.

* * * * *